United States Patent

[11] 3,620,933

[72] Inventors John J. Grunwald New Haven; Eugene D. D'Ottavio, Thomaston; Harold L. Rhodenizer, Bethlehem; Michael S. Lombardo, Waterbury, all of Conn.

[21] Appl. No. 889,472

[22] Filed Dec. 31, 1969

[45] Patented Nov. 16, 1971

[73] Assignee MacDermid Incorporated Waterbury, Conn.

[54] FORMING PLASTIC PARTS HAVING SURFACES RECEPTIVE TO ADHERENT COATINGS
11 Claims, 6 Drawing Figs.

[52] U.S. Cl. .......... 204/15, 117/47, 117/212, 117/217, 204/20, 204/30, 204/38, 204/141

[51] Int. Cl. .......... C23b 5/48, B44d 1/18

[50] Field of Search .......... 204/15, 20, 30, 38; 117/217, 47 R

[56] References Cited

UNITED STATES PATENTS

| | | | |
|---|---|---|---|
| 3,099,608 | 7/1963 | Radovsky et al. .......... | 204/30 X |
| 3,317,330 | 5/1967 | Livingston et al. .......... | 106/287 |
| 3,347,695 | 10/1967 | Stancell et al. .......... | 117/38 |

*Primary Examiner*—John H. Mack
*Assistant Examiner*—Neil A. Kaplan
*Attorneys*—Steward & Steward, Merrill F. Steward, Donald T. Steward and Walter D. Hunter

ABSTRACT: Plastic parts are formed against an anodically treated aluminum surface by molding, laminating, etc., whereby the surface of the formed part after removal of or separation from the aluminum has a high-energy level and is receptive to adherent coatings of paint or metal plate. In particular, in addition to preparing plastic surfaces for acceptance and adhesion of paints, inks or the like, printed circuit boards and other metal-plated plastic substrates are prepared by first bonding anodically treated aluminum foil to a plastic substrate to provide a sacrificial cladding on the substrate, then stripping the aluminum chemically from the substrate, catalyzing the stripped surface and depositing a conductor metal plate thereon by electroless and/or electrolytic deposition, after application of a resist pattern of the desired circuit in the case of printed circuit boards.

Figure 1:
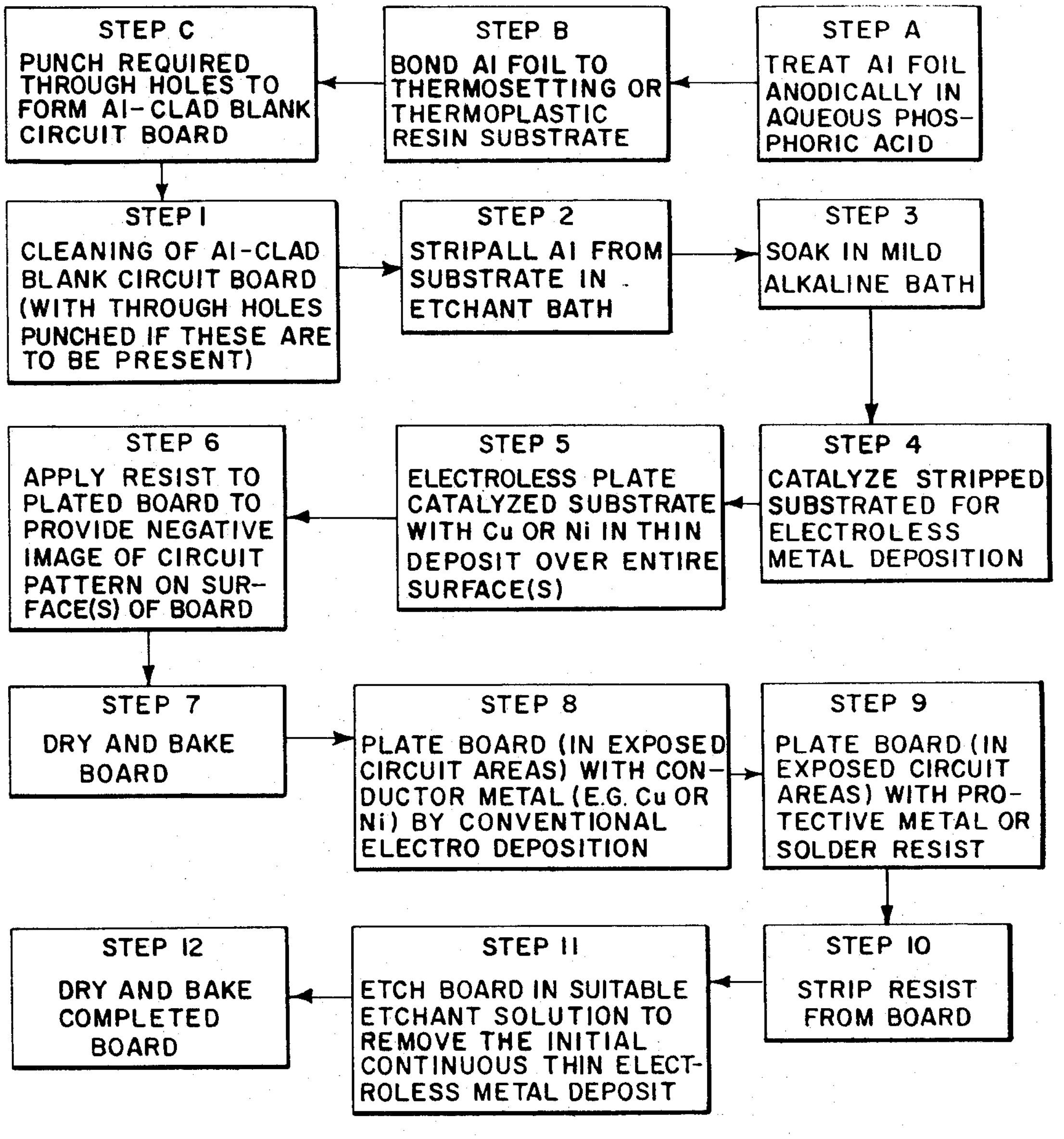

INVENTORS
JOHN J. GRUNWALD
EUGENE D. D'OTTAVIO
HAROLD L. RHODENIZER
MICHAEL S. LOMBARDO

BY Steward and Steward

ATTORNEYS

FORMING PLASTIC PARTS HAVING SURFACES RECEPTIVE TO ADHERENT COATINGS

This invention relates to a process in which plastic parts are formed against an anodically treated aluminum surface by molding, laminating, etc., whereby the surface of the formed part after removal of or separation from the aluminum has a high-energy level and is receptive to adherent coatings of paint or metal plate. In particular, in addition to preparing plastic surfaces for acceptance and adhesion of paints, inks or the like, printed circuit boards and other metal-plated plastic substrates are prepared by first bonding anodically treated aluminum foil to a plastic substrate to provide a sacrificial cladding on the substrate, then stripping the aluminum chemically from the substrate, catalyzing the stripped surface and depositing a conductor metal plate thereon by electroless and/or electrolytic deposition, after application of a resist pattern of the desired circuit in the case of printed circuit boards.

Two distinct methods of manufacture of printed circuit boards for use in electronic equipment have, in general, been proposed in the prior art. One is termed the "subtractive" method and is the one used predominantly at the present time. The other method is called the "additive" procedure.

The manufacture of the printed circuit by the subtractive method starts with a laminate or composite consisting of a sheet of insulating material as a base or substrate, one or both sides being covered with a thin copper foil on the order of 0.001 to 0.003 inch thick. The foil is secured to the insulating base by means of an appropriate adhesive or by the application of heat and pressure in forming the laminated structure. The substrate or insulating base used to support the conductive circuit is usually made in the form of a flat sheet of compression molded epoxy-glass or phenolic resin material.

After the configuration of the desired electric circuit to be printed on the board has been designed, the "art work" is prepared which consists of a positive or negative transparency or silk screen bearing the desired circuit image. In the photographic reproduction method, the copper-sheathed plastic substrate is covered with a photosensitive resist, this being generally a liquid polymeric preparation which includes light-sensitive initiators and becomes solvent resistant after exposure to ultraviolet radiation. A latent image of the desired circuit is formed in the photoresist on the surface of the board by exposure through the transparency, and this image is developed in an appropriate solvent which removes the unexposed photoresist material. Using the silk screen, a chemical resist is squeegeed through the screen onto the board to give the desired pattern. In this subtractive method, therefore the resist coating formed on the board is a positive image of the desired circuit so that the copper foil to be retained on the surface of the board is protected with photoresist material. The remaining portion of the copper foil, corresponding to the noncircuit areas of the final printed board, is left unprotected and is then etched away in a suitable solution, commonly ferric chloride or an ammoniacal solution of the type described in U.S. Pat. No. 3,231,503. The resulting circuit board containing the desired circuit configuration is then treated in a suitable solvent to strip the remaining resist coating on the retained copper foil, and is ready for additional plating or solder application, mounting of accessory electronic components, etc.

In a modification of this procedure, where a circuit board is provided with copper laminates on both sides and it is desired to form conductor circuits on these opposite faces with electrical interconnection between certain areas on the opposite faces, through holes are drilled or punched through the boards as required, and the walls of these holes are plated with a metal to electrically interconnect the opposed surface conductor areas. Therefore before the copper-clad boards can be put through the subtractive method of forming the desired printed circuits on their opposite faces, they must be subjected to a series of operations designed to plate a thin deposit of copper, nickel, etc., on the walls of the through holes to join the surface conductor areas. The procedure here is well known in the art and generally involves punching the holes, cleaning the copper-clad faces of the laminate, light etching or pickling and then catalyzing, followed by electroless deposition (or in some cases by direct electrodeposition) of copper over the entire exposed surface, including the nonconductive walls of the through holes in the plastic substrate as well of course as the copper-clad faces of the substrate. After applying a circuit pattern of organic or polymeric masking resist, the conductor area (i.e. circuit areas) are electrolytically plated with conductor metal to desired thickness and then covered with a metallic resist (e.g. tin-lead). The organic resist is then stripped by a suitable solvent, leaving the noncircuit areas of copper exposed, and this is then removed by a suitable acid or alkali etchant solution.

A major drawback of the foregoing subtractive method arises from the occurrence during etching away of the noncircuit areas of the phenomenon known as "undercut" in the metal remaining on the board. Undercut is the term of art employed to describe the lateral undermining of the conductor area in the resulting circuit configuration formed on the surface of the board. In fact, this phenomenon of undercutting greatly limits the fineness or narrowness of the conductor areas that can be tolerated; that is, these conductor areas must be overdesigned from a width standpoint to allow for such undercut. This of course impedes attempts toward further miniaturization of the circuit boards. Also, where the nature of the circuit requires the use of the heavier or thicker copper foil on the surface of the plastic substrate, a longer residence time of the board in the etching solution must be maintained, during which there is an inherent tendency for the resist material itself to be undermined and partially removed in some areas of the board, thereby causing rejects.

Thus the problem in following the so-called subtractive method of producing printed circuit boards is one of greatly limiting the design, insofar as space requirements are concerned, of the desired printed circuits.

Another major disadvantage of the subtractive method is that the copper-clad board is expensive and in preparing the printed circuit board all but a small fraction of the initial copper cladding is etched away completely. Substantial quantities of the acid etching solutions are utilized in stripping away the excess copper. The depleted copper-laden etchant solutions, which may be hazardous to handle, can be treated to recover the valuable copper content. However, because of the complexity of such operations, the actual savings resulting is usually small compared to the initial cost of the copper-clad board. The typical manufacturer of printed circuit boards is generally not equipped to operate such metal recovery processes. Alternatively, the waste etchant solutions can be discarded after being subjected to appropriate waste treatment operations which are expensive and time consuming and, in addition, the value of the copper contained in the etchant solutions is lost.

An alternative to the subtractive process discussed above has been proposed heretofore, and is known as the additive method of manufacturing such boards. This procedure starts with a nonconductive substrate, free of any copper foil, to which a masking resist circuit pattern is applied so that only the desired areas of the substrate are made conductive. The procedure obviously presents a number of advantages over the subtractive method and many attempts have been made to produce suitable additive circuit boards. To date, however, these attempts have not been broadly accepted in commercial production. The major obstacle to successful additive printed circuit board is the difficulty of obtaining adequate adhesion between the chemically deposited copper or other conductive metal and the dielectric substrate. One of the more recent procedures that has been developed is described in "Transactions of the Institute of Metal Finishing," 1968, Vol. 46, pages 194–197. The procedure there described involves the successive steps of treating the surface of the bare substrate board with a "keying" agent, punching the board to provide the necessary through holes, plating a very thin initial deposit of nickel over the entire surface using an electroless nickel bath, then applying and developing a resist to form a negative image of the desired circuit pattern, followed by additional metal plating by conventional electrodeposition techniques to build up the conductor portions of the circuit to the desired thickness. After this the resist is stripped and the printed circuit board is etched to completely strip away the initial, thin, electroless metal deposit from the noncircuit areas, leaving only the heavier plate, i.e., the circuit areas, on the board. The board is then treated in the usual way to provide a protective film of precious metal or lacquer on the printed conductor circuit, or alternatively to cover this with a solder coating to facilitate connection of the usual accessory electronic components incorporated into the finished circuit board.

The foregoing method has certain advantages, particularly in that it facilitates electrodeposition of electrically noncontinuous circuits and avoids or reduces the need of further electroless plating operations. However, a difficulty with this method resides in its use of a keying agent which, although not fully identified in the foregoing article, appears to be polymeric coating. Careful preparation and application of this coating material is required in order to obtain effective and consistent results. Furthermore, as in most cases where attempts have been made to use adhesives as intermediates for bonding copper or other conductor metals to a plastic substrate, there are always problems in obtaining proper dielectric properties of the adhesive, accurate and consistent reproducibility of the polymeric bonding material, and avoiding fragility or brittleness of the bond, to name but a few. It appears also that the reference process is better suited to thermoplastic resin substrates rather than thermosetting substrates, although the latter are much preferred for electronic applications.

One of the primary contributions of this invention, accordingly, is to provide a method for preparing printed circuit boards that employs a sacrificial metal cladding on a laminate and one that obviates the use of polymeric adhesive coatings and yet produces satisfactory adhesion of the copper or other conductive metal to the dielectric substrate upon plating.

Another contribution of this invention is to provide a method for preparing laminates comprising aluminum sheet or foil bonded to a thermoset or thermoplastic resin substrate which, in addition, to being useful in preparing circuit boards may be advantageously employed in a number of other applications. For example, a laminate of this invention comprising aluminum foil bonded to a thermoplastic sheet, such as sheet of polycarbonate, after stripping of the aluminum foil yields a plastic sheet having a surface receptive to an adherent coating of paint or to plated metal coatings.

The use of aluminum-clad laminates in preparing circuit boards offers a number of advantages over the copper laminate board employed in known additive circuit board processes such as that set forth in Rhodenizer, Grunwald, and Innes application Ser. No. 823,354, filed May 9. 1969. For example, aluminum is cheaper than copper and it is easier to strip from the plastic substrate.

In brief, the procedure of this invention as it relates to circuit board manufacture, involves first preparing a metal clad laminate having a sheet or foil of aluminum bonded to it by heat and/or pressure in the manner commonly employed today in preparing blank circuit boards for use in the subtractive method, the aluminum being subsequently stripped to provide a dielectric surface onto which metals can be deposited with good adhesion.

PREPARATION OF THE ALUMINUM FOIL

In preparing a circuit board laminate, the first operation involves treating the aluminum sheet or foil anodically in an electrolytic bath containing from about 10–60 percent by weight of phosphoric acid at a temperature of about 70° to about 130° F., for about 1 to about 30 minutes or more and at a current density of about 10 a.s.f. (amperes per square foot) to about 75 a.s.f. Preferably, the anodic workpiece is treated at about 90°–110° F., for about 3 to about 7 minutes at 25 to about 55 a.s.f., in an electrolytic bath containing about 20 to about 40 percent by weight of phosphoric acid. The resulting product is aluminum sheet or foil with a tough, adherent coating which is believed to be an oxide coating on its surfaces. While anodizing of aluminum is conventionally conducted with solutions of sulfuric acid, chromic acid, oxalic acid, etc., it has been found that only aluminum which has been treated anodically in a bath containing phosphoric acid is useful in preparing the circuit board laminates of this invention.

Aluminum alloys, such as aluminum-copper, aluminum-magnesium, aluminum-copper-magnesium-zinc, etc., as well as pure aluminum foil and sheet may be utilized in preparing the aluminum-clad laminates of this invention. The thickness of the aluminum metal can be varied over a wide range and generally will be from about 0.001 to about 0.0098 inch or more and, preferably, will be about 0.001 to about 0.003 inch.

PREPARATION OF LAMINATES

The laminates of the present invention can be prepared using a wide variety of plastic substrates well known in the art. Useful plastics include those prepare from both thermoplastic and thermosetting resins. Typical thermosetting resins which are useful in this invention are the phenolic-type materials, such as the copolymers of phenol, resorcinol, a cresol, or a xylenol with formaldehyde or furfural. Polyesters, prepared by reacting dicarboxylic compounds with dihydric alcohols such as the reaction products of phthalic or maleic anhydride with mono-, di- or polyethylene glycols, form a suitable class of thermosetting resins. An especially valuable class of thermosetting resins include the epoxy resins such as the reaction product of epichlorohydrin and bisphenol A. Thermoplastic materials suitable for use in this invention include polyolefins, such as polypropylene; polysulfones, ABS, polycarbonate, polyphenylene oxides, etc.

Thermosetting resins employed in preparing one type of the novel laminates of this invention are utilized in the form of thin sheets of resin known as prepegs. In the prepegs the thermosetting resins are in a partially cured condition known as the B-stage and they are still fusible under heat and pressure. Resins in the B-stage can be completely cured by the application of sufficient heat and pressure to yield tough, infusible thermoset materials. Usually, the thin sheets of thermosetting resin employed, i.e., the fibers, prepegs, contain reinforcing element which can be such materials as glass fibers, asbestos, mica, paper, nylon fiber, etc. Generally, the reinforcing elements comprise from about 30 to about 60 percent by weight of the reinforced plastic. A typical polyester- or epoxy-reinforced laminate with a thickness of 0.125±0.005 inch and a resin content of about 38±2 percent has 12 plies of glass fabric. The tensile strength of such a laminate is about 50,000 p.s.i. and the compression strength is about 62,000 p.s.i. (dry). The preferred reinforcing agent is glass fiber and glass fiber is defined as any fibrous glass unit including filament yarns, rovings, reinforcing mats, stable yarns, woven fabrics and chopped fibers. Woven fabrics of glass cloth may be heat treated or chemically treated with a chrome acrylate complex, an amine functional silane or an epoxy functional silane which act as coupling agents between the glass and the resin and improve the adhesion of the resin binder and the glass.

In the process of this invention any thermosetting resin capable of forming a B-stage or partially cured resin which is essentially tack free and still fusible under heat and pressure and which is capable of being further cured by the further application of heat and pressure to give a tough, infusible thermoset resin substrate can be utilized. A wide variety of thermosetting resins useful in preparing the laminates of this invention are known in the art. For example, suitable phenolic resins are described in U.S. Pat. Nos. 2,606,855; 2,622,045; 2,716,286 and 2,757,443. Suitable epoxy resins and polyester resins are described in U.S. Pat. Nos. 3,335,050; 3,399,268, etc. The preparation of a suitable prepeg sheet containing a thermosetting resin in the B-stage is described in U.S. Pat. No. 3,433,888.

A laminate suitable for use in the additive circuit board process of this invention is prepared, for example, by placing the B-stage thermosetting epoxy coated and impregnated glass fabric sheet in a laminating press on top of a sheet of aluminum having an anodically treated surface abutting the resin and afterwards further curing the thermosetting resin under the influence of heat and pressure. If a laminate clad on both sides with metal foil is desired, it can be prepared in the same manner by placing sheets of the aluminum sheet or foil above and below the sheet of partially cured, i.e., B-stage, thermosetting resin in the laminating press in such a way that the anodically treated surfaces contact the resin sheet. Where the laminate is clad on one side only, a sheet of aluminum (unoxidized) foil is utilized to prevent adherence or sticking of the thermosetting resin sheet to the platen of the laminating press.

The actual bonding of the B-stage thermosetting resin sheet to the anodically treated aluminum surface is accomplished by simultaneously pressing the laminating components together and baking at a temperature of about 250° to about 450° F., and preferably at 300° to 400° F., at a pressure of about 5 to about 1,000 p.s.i.g., and for a period of time ranging from about 5 minutes to about 30 minutes. During the laminating process it may be necessary to water cool the laminate under the pressure applied in order to promote temperature control of the resin during the curing cycle.

Bonding of a thermoplastic substrate to the aluminum foil is carried out by pressing together a sheet of the thermoplastic material and aluminum foil having an anodically treated surface next to the plastic in a preheated laminating press at a pressure which is generally about 100 to about 1,000 p.s.i.g., and at a temperature of about 150° to about 350° F., or more. The time of the pressing operation may be varied over a wide range and generally will be from about 0.5 to about 10 minutes or more depending upon the particular plastic utilized and the pressure employed. Alternatively, the thermoplastic sheet and the aluminum foil are placed so that the anodically treated surface of the aluminum abuts the surface of the plastic in a lamination press preheated to a temperature of from about 150° to about 350° F., or higher depending on the nature of the plastic. The press is closed and brought up to an initial pressure of about 150 to about 500 p.s.i. after which the pressure is allowed to decrease to 0 p.s.i.g., as plastic softens and flows at which point the laminate is removed from the press.

The metal foil thickness can be varied widely as previously pointed out although, preferably, it will be from about 0.001 to about 0.003 inch in thickness. In a like manner, the thickness of the thermosetting or thermoplastic resin sheet utilized may vary from about 0.0015 to about 0.125 inch or more.

The following examples illustrate the preparation of a variety of laminates of this invention and are to be considered not limitive.

EXAMPLE I

A sheet of aluminum foil having a thickness of about 0.002 inch is immersed in an alkaline soak cleaner bath for 5 minutes at a temperature of 190° F., to remove surface grime and oils. The clean aluminum foil is then preferably etched in ammonium bifluoride at room temperature for 3 minutes and then treated anodically in an electrolytic bath containing 10 weight percent phosphoric acid for 10 minutes at a current density of 10 a.s.f., and at a temperature of 110° F.

The anodically treated aluminum foil is then placed in a laminating press on top of a sheet of an epoxy B-stage resin having a thickness of about 0.003 inches. A sheet of cellophane is placed between the epoxy resin and the platen in order to prevent sticking during the curing operation.

The press, preheated to a temperature of 350° F., is closed and the laminate components are heated at a pressure of about 5 p.s.i., for about 30 seconds after which the pressure is raised to 250 p.s.i. and curing is continued at the same temperature for about 15 minutes. The result is an aluminum-clad laminate in which the aluminum foil is firmly adhered to the cured, hard, infusible thermoset resin substrate.

EXAMPLE II

A sheet of aluminum having a thickness of about 0.001 inch is anodically treated in a bath containing 30 weight percent of phosphoric acid for about 1 minute at 40 a.s.f. and at a temperature of 90° F. Prior to the anodic treatment, the aluminum sheet is immersed in an alkaline soak cleaner for a period of about 10 minutes at 100° F., in order to remove surface soils.

Two sheets of the thus anodically treated aluminum are placed above and below a sheet of partially cured XXXP phenolic (B-stage) on the platen of a laminating press. Each of the aluminum sheets is arranged so that an anodically treated surface contacts the plastic sheet. The laminate is formed by heating the laminate components at a pressure of about 500 p.s.i. and a temperature of about 350° F. for 25 minutes. The result is a laminate clad on both sides with firmly bonded aluminum foil and having a cured, hard, infusible phenolic substrate base.

EXAMPLE III

In this example a sheet of aluminum foil having a thickness of 0.003 inch is first immersed in a solution of trichloroethylene at room temperature for about 1 minute following which it is etched in 30 percent by vol. hydrochloric acid for 15 seconds at 85° F. The thus cleaned aluminum foil is then anodically treated in a bath containing about 60 percent by weight of phosphoric acid at 50 a.s.f. for about 5 minutes at 75° F.

Two sheets of the anodically treated aluminum foil are placed above and below an epoxy resin (B-stage) prepared from epichlorhydrin and bisphenol A in the presence of an acid-curing agent. The B-stage resin is dry, nontacky and nonadherent and can be handled without difficulty. The aluminum sheets are placed in the laminating press in such a manner that anodically treated surfaces thereon contact the thermosetting resin.

The laminating press is closed and the platens heated gradually to a temperature of 350° F., after which the laminating components are maintained at that temperature for about 20 minutes at a pressure of 500 p.s.i.

Examination of the resulting laminate indicates that the aluminum sheets are strongly bonded to the cured thermoset substrate.

EXAMPLE IV

Aluminum foil (Type 1145, H–18–0.0025 inch in thickness) was treated anodically in an aqueous electrolytic bath containing 30 percent by weight of phosphoric acid at 100° F., for 5 minutes at a current density of 40 a.s.f.

A sheet of the anodically treated aluminum foil was placed in a laminating press preheated to a temperature of 325° F. on the upper surface of a sheet of polypropylene (titanium dioxide filled) having a thickness of 0.006 inch. The aluminum sheet was positioned so that an anodically treated surface contacts the plastic sheet and to prevent sticking, a sheet of cellophane was put between the platen and the lower surface of the polypropylene.

The press was closed, the pressure brought up to 200 p.s.i.g. and then, as the plastic flowed, the pressure gradually dropped off to 0 p.s.i.g. after which the laminate was removed from the press.

After the aluminum foil had been stripped by immersing the laminate in 30 percent hydrochloric acid for 10 minutes at 160° F., the surface was plated electrolessly with nickel and then electrolytically with copper using conventional techniques. The adherent, plated metal coating exhibited an adhesion value of about 3 pounds per inch.

EXAMPLE V

A sheet of polypropylene having a thickness of 0.125 inch was laminated to an anodically treated aluminum sheet (0.002 inch thickness) in the same manner as described in example IV. After the aluminum foil had been removed by immersion in hydrochloric acid (40 percent by weight), the surface was painted with an acrylic base lacquer and then allowed to dry. The paint adhered strongly to the prepared surface and when adhesively coated tape was pressed against the paint surface and removed by pulling at a 90° angle, the painted coating remained intact on the substrate surface.

EXAMPLE VI

A laminate was prepared from a sheet of ABS (0.125 inch in thickness) and anodically treated aluminum foil (0.003 inch in thickness) in the same manner as described in example IV, with the exception that the pressure utilized was 250 p.s.i.g. After stripping the aluminum from the laminate as described in example IV, a part of the substrate was plated electrolessly with nickel and then electroplated with copper to yield a plated metal substrate in which the metal coating had a peel strength of about 3 pounds per inch.

Another part of the substrate was painted with an acrylic base lacquer which on drying, adhered tightly to the treated surface.

PREPARATION OF PRINTED CIRCUIT BOARDS

In the procedure of this invention the metal-clad laminate utilized is one prepared as previously described in which the metal cladding is aluminum, bonded to the thermoset resin by heat and pressure and having an anodically treated surface abutting the resin. In this case, the metal sheet or foil may be as thin as practical since this cladding will not be used for circuit-forming purposes in accordance with the present invention and it will be stripped or etched completely from the board prior to application of any circuit. Following the stripping of the aluminum cladding the substrate is catalyzed in a known manner in a tin-palladium catalyst solution, and the board is processed in either of two ways to provide an adherent conductor metal circuit on its surface. Under one procedure, the catalyzed board is elecrolessly plated with a thin, initial deposit of conductor metal over its entire surface, followed by application of a circuit pattern of suitable resist to permit subsequent buildup by electrolytic or electroless deposition in the circuit areas of additional conductor metal to final desired thickness. Alternatively, the procedure may involve applying and developing a resist circuit pattern immediately following catalyzing, and then plating the circuit areas only with conductive metal by electroless plating technique, or even by direct electrolytic plating in some circumstances as described for example in U.S. Pat. No. 3,099,608, Radovsky et al.

Both procedures just described are satisfactory, each having some inherent advantages that may make one preferable to some operators over the other in a particular application. For example, the first procedure mentioned provides a means of facilitating electrodeposition in the formation of the conductor circuit pattern, and this is inherently less expensive than electroless deposition procedures. However, using this method requires a final brief etching step to remove the initial thin continuous electroless deposit of conductive metal after the buildup of the circuit has been completed.

Whichever of the two procedures here described is employed, it is an important aspect of this invention that the circuit board is heated or baked at one or more points in its development to promote effective bonding between the conductor metal and the resin substrate. Such heating or baking operation can be carried out at any one or more points, e.g.: following the catalyzing step, after application of the continuous initial thin conductor metal layer; after application of the resist; after development of the resist circuit pattern; or after completion of the circuit board, depending on which procedure is used. While such heating or baking is not required at all of these stages, it is always required at least once following the catalyzing stage and is instrumental in obtaining good adhesion.

While the mechanisms of better adhesion through starting with an aluminum-clad laminate and then chemically stripping all the metal away before electroless deposition or the coating process is begun is not yet well understood, it appears that some interaction involving or caused by the anodically treated surface on the aluminum foil at the metal-plastic interface during the formation of the plastic surface to be bonded and subsequent stripping of the anodically treated foil chemically is the reason for the greatly improved adhesion between the substrate and the coating, providing peel strengths of at least 5 and as high as 15 pounds per inch. It is believed that an essential aspect of the formation of a bondable surface is that the plastic is capable of flowing and conforming to the anodically treated surface. The heating or baking step mentioned above is, moreover, essential to the improved result. After the anodically treated aluminum cladding has been etched away, the result is a plastic substrate with a highly active surface which is water wettable.

FIGS. 1 through 6 inclusive represent block flow diagrams of the steps involved in several different procedures for preparing circuit boards in accordance with this invention.

Discussion of some of the procedures that can be followed will be helpful to a further understanding of the invention.

EXAMPLE VII

With reference to FIG. 1 of the accompanying drawings, the various major steps in the preparation of a completed printed circuit board are given in flow diagram form. It will of course be understood that conventional intermediate treatment steps, such as water rinsing where required, have been omitted from this flow diagram but their use as needed will be obvious to those experienced in this art.

Steps A–C inclusive relate to the preparation of the aluminum-clad blank circuit board with through holes punched in it.

In step 1, the aluminum-clad board, with through holes already punched in it, if these are to be used in the completed circuit board, is optionally cleaned of any surface grime. Molded thermoset resin of glass-epoxy or phenolic base type generally is desired as the substrate for dielectric properties, as well as resistance to structural deformation or warping due to temperature and humidity variations.

In step 2, the board is dipped in or otherwise contacted with an aluminum etching solution at a temperature of about 80° to about 180° F. for a period of about 2 to about 30 minutes to completely strip the anodically treated aluminum cladding from the surface board. Any of the usually employed aluminum etchant solutions can be employed. Typically suitable solutions include hydrochloric acid (about 10 to about 40 percent by weight) and alkali metal hydroxides, such as sodium, potassium and lithium hydroxide (5 to about 20 percent by weight). In general, all stripping solutions are operative in the practice of the present invention so long as they do not cause excessive attack of the nonconductive substrate.

After a suitable water rinse and submersion at step 3 in a mild alkaline bath, the board is catalyzed at step 4 by either the two step activation procedure using stannous chloride in hydrochloric acid, followed by a dip in palladium chloride in hydrochloric acid, a well-known procedure as described in the previously mentioned reference article; or the catalysis may be effected by the one-step procedure employing a tin-palladium hydrosol such as that disclosed in U.S. Pat. No. 3,532,518.

Usually also it is desirable to subject the catalyzed board to an accelerating solution, for example a dilute solution of suitable acid or alkali.

After rinsing, the board is then plated at step 5 in a electroless metal-plating bath of copper or nickel. Any of the commercially available electroless copper or nickel baths is suitable. Typical compositions of such baths are shown in U.S. Pat. Nos. 2,874,072; 3,075,855 and 3,095,309 for copper; and 2,532,283; 2,990,296 and 3,062,666 for nickel. The metal deposit here desired is only a very thin but continuous layer of the order of 10 to 30 millionths of an inch over the entire surface of the board, as well as the wall surfaces of any through holes that may be present. Its purpose is merely to provide an initial conductive surface which will interconnect all of the circuit areas to be printed on the board in order to facilitate electrodeposition of such circuit areas in subsequent steps.

Again after adequate rinsing, the board is advanced at step 6 to a station where a resist coating is applied to the surface or surfaces on which the conductive circuits are to be formed. Here again the operator is afforded a choice of several methods in the selection and application of the resist coating, all of which are known and conventional in the art. Under one method the circuit design may be outlined by a chemical resist applied by squeegeeing it through an appropriate silk screen designed to produce coverage of the noncircuit areas of the board while leaving the circuit areas themselves free of resist material. Under the alternate resist application procedure, a positive or negative photoresist composition is applied to the entire surface of the board and this is exposed to a light source through a suitable film of the desired circuit configuration, and the photoresist material is then developed by an appropriate solvent to strip away the exposed or unexposed photoresist material on the board, depending on the system used. In either case the board is then dried at step 7 to cause the resist coating to firmly adhere to the surface. While heating may be necessary for setting the resist composition so that it will withstand the subsequent operations performed on the board, it also may serve as the baking operation referred to hereinabove as being an integral part of this invention. In this event, it is preferred to heat the board to a temperature of approximately 300° F. for a period of about 15 minutes. Considerable latitude in the temperature and time is possible, and in general lower temperatures will require longer times and vice versa. Practical operating conditions dictate the use of baking temperatures substantially above ambient, and preferably at or above the boiling point of water if atmospheric pressure is maintained. Obviously the temperature employed cannot be so high as to cause charring or melting of the resin substrate.

In this example VII, the board is now ready at step 8 for plating of the exposed circuit areas to build up a desired thickness of conductor metal in those areas. By providing the initial continuous thin metal deposit, conventional electrodeposition of additional conductor metal or metals on the circuit areas is greatly facilitated since a single connection at any point on the conductive surface of the board will effect electrodeposition of metal at all exposed circuit areas when the board is made the cathode in a conventional electrolytic plating bath. Electroless copper or nickel can be conveniently used as the conductor metal, and the plating operation is continued to build up a sufficiently thick deposit of such metal to meet the requirements of the electronic circuit in which the board is used. Although as indicated copper or nickel may both serve adequately, there is some indication at present that electroless nickel performs better in many instances.

Subsequent plating of the circuit areas in step 9 with a protective metal such as gold, rhodium, or with solder as a resist or to facilitate subsequent attachment of accessory electronic components to the board, can also be effected by electrochemical deposition from suitable metal-plating solutions. After the conductor circuit has been completely built up, the board is then subjected at step 10 to a stripping solution to remove the chemical or photochemical resist from the noncircuit areas. This leaves the surface of the board still covered with the thin initial conductor metal deposit over the entire surface. This coating is then removed at step 11 by immersing the board in a suitable etchant, such as dilute nitric acid, to strip the noncircuit areas of any conductive metal. The protective metal coating previously applied to the circuit areas prevents or impedes any substantial attack of the etchant on those areas during this step. It is important therefore that an etchant be selected which does not appreciably attack this protective metal coating.

The finished board is then rinsed, dried and baked at step 12. If the procedure followed has not incorporated baking the board at approximately 220° F. for 30 minutes at one of the earlier steps, this can take place at this point in the process.

EXAMPLE VIII

Figure 2:
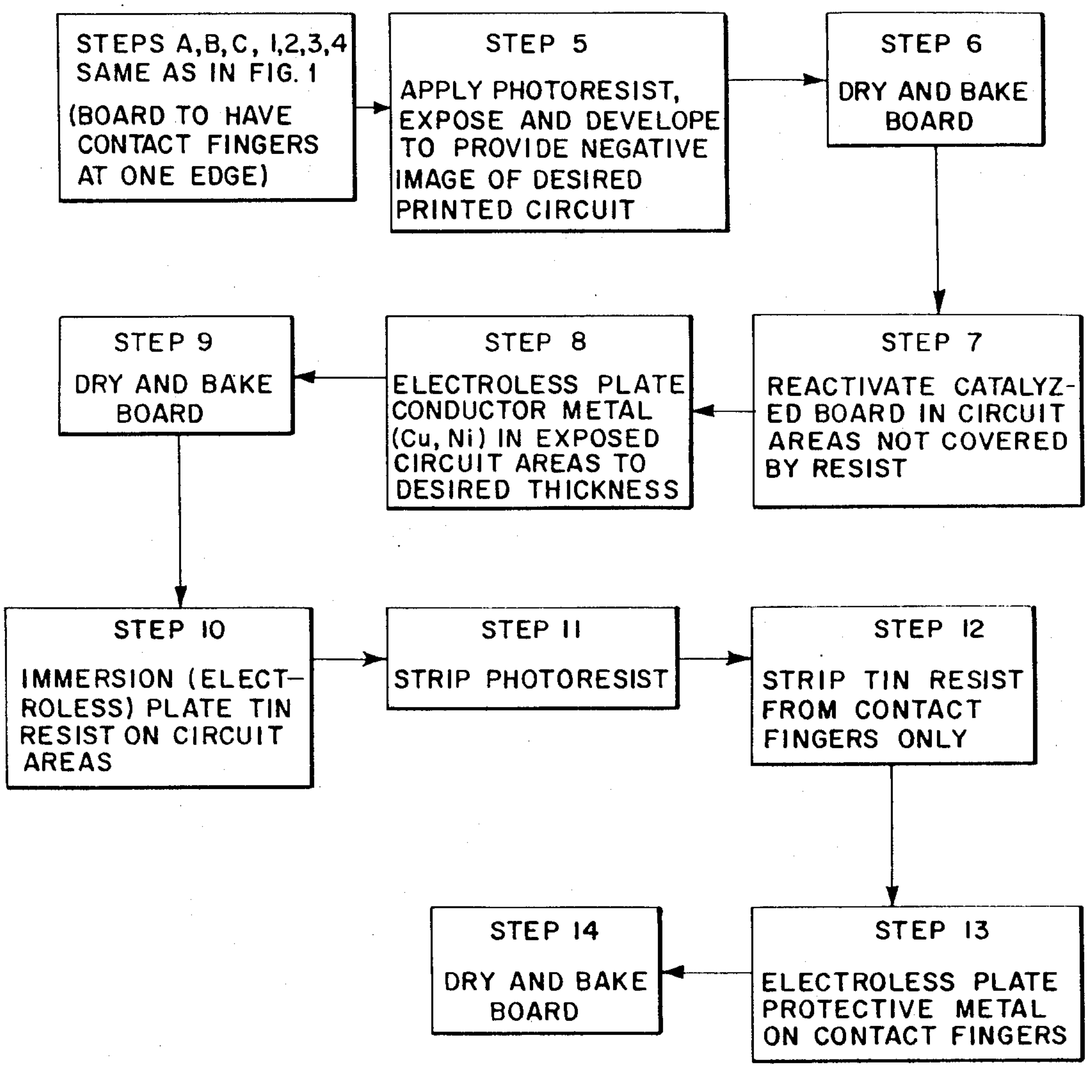

A modified procedure is shown in the flow diagram of FIG. 2. Here again the initial aluminum-clad board is stripped of its initial metal foil and anodized coating thereon, rinsed and soaked in a mild alkaline bath and catalyzed for electroless metal deposition, all as in the first four steps of example VII. In this example VIII the board is then coated at step 5 with a photoresist and the desired circuit configuration is exposed through a positive transparency and the photoresist composition developed to provide negative image of the desired printed circuit, as before. The board is dried, baked at step 6 and preferably is subjected to a dilute sulfuric acid solution at step 7 to reactivate the exposed catalyzed resin surface in the circuit areas. Electroless nickel or copper at step 3 is then deposited in the exposed circuit areas to the total desired thickness, and the board again dried and baked at step 9. An immersion coating of tin or solder alloy is applied at step 10 to the exposed conductor or circuit area, and the photoresist is stripped from the noncircuit area using an appropriate solvent for the particular resist material employed. This provides a finished board unless it is desired to further plate contact finger areas commonly incorporated in a typical circuit board with a precious metal such as gold or rhodium to improve the contact surface. In this event, the photoresist is stripped at step 11 and the tin resist is then stripped at step 12 from the contact finger areas and the board subjected to further electroless plating at step 13 in a gold or rhodium electroless plating bath. Again the board is dried and baked at step 14, and if it has not previously been submitted to an elevated baking operation of the type described above, this step may be included at this point.

EXAMPLE IX

Figure 3:
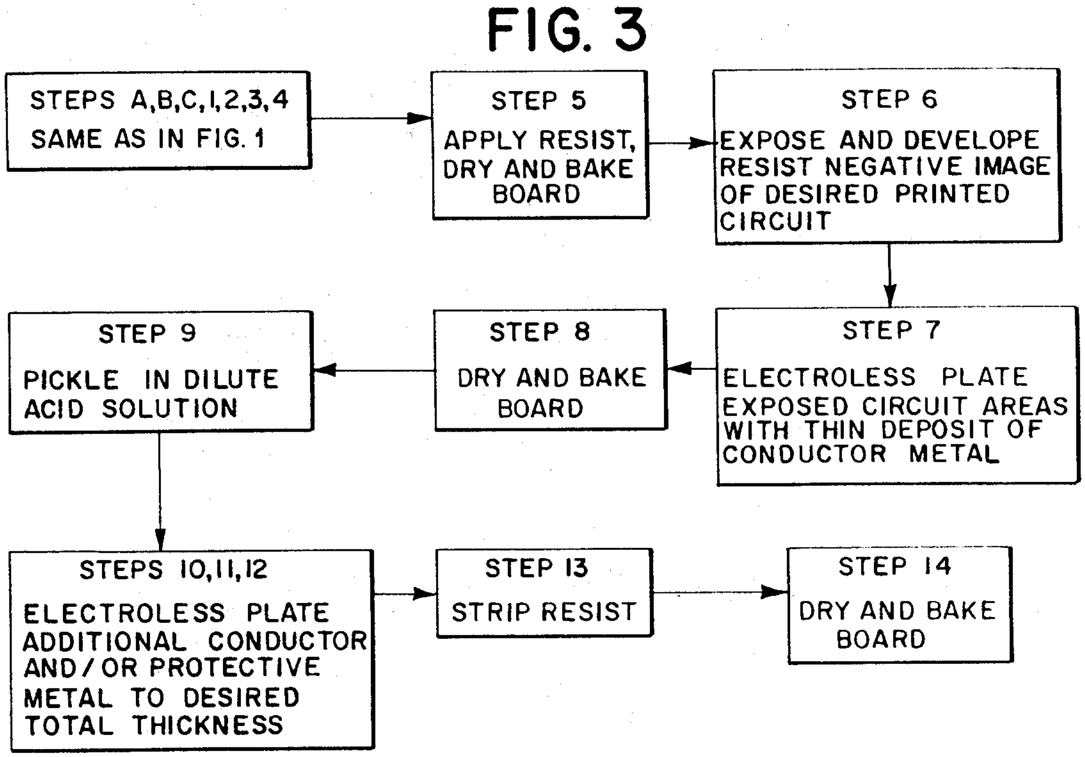

The procedure illustrated in FIG. 3 is essentially similar to that shown in FIG. 2, but in this instance the resist coating at step 5 is baked before exposure and development. After development of the resist (step 6) only a very thin (10 to 30 millionths of an inch) deposit of conductor metal is deposited initially from an electroless plating bath of the metal (step 7), and the board is then dried and baked at approximately 220° F. for 30 minutes (step 8). The board is pickled in dilute 10 percent sulfuric acid solution (step 9) to reactivate the initial conductor metal deposit for subsequent electroless plating of copper, nickel and gold in that order (steps 10, 11, 12), followed by stripping of the resist composition (step 13) and further drying and baking of the finished board.

EXAMPLE X

Figure 4:
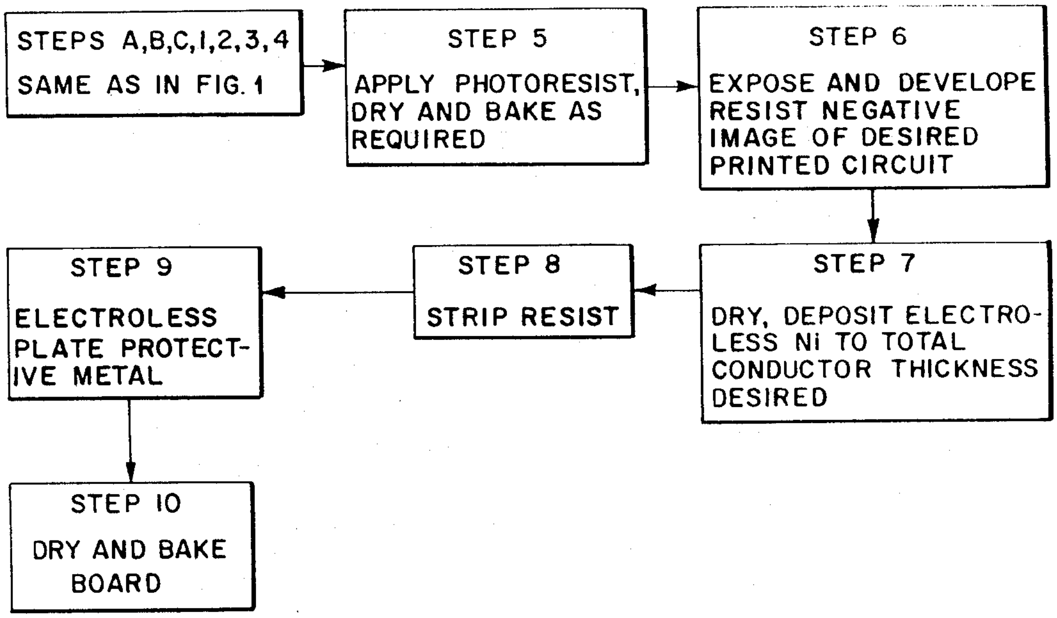

An all-nickel conductor circuit is produced in this example, as diagrammatically shown in FIG. 4. The same general sequence of steps is otherwise employed.

EXAMPLE XI

Figure 5:
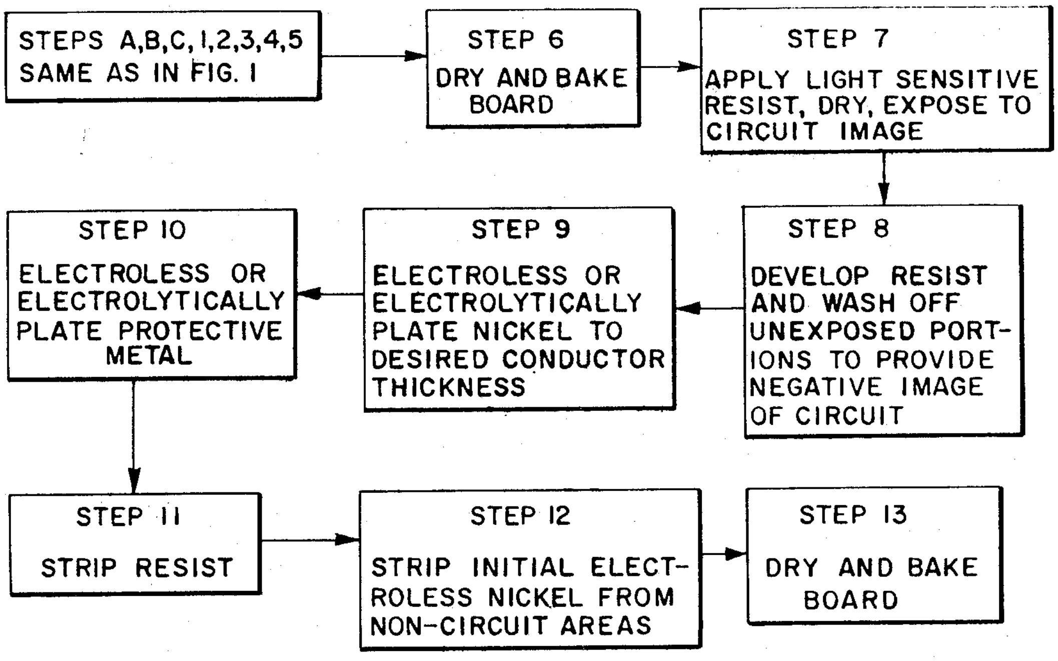
Figure 6:
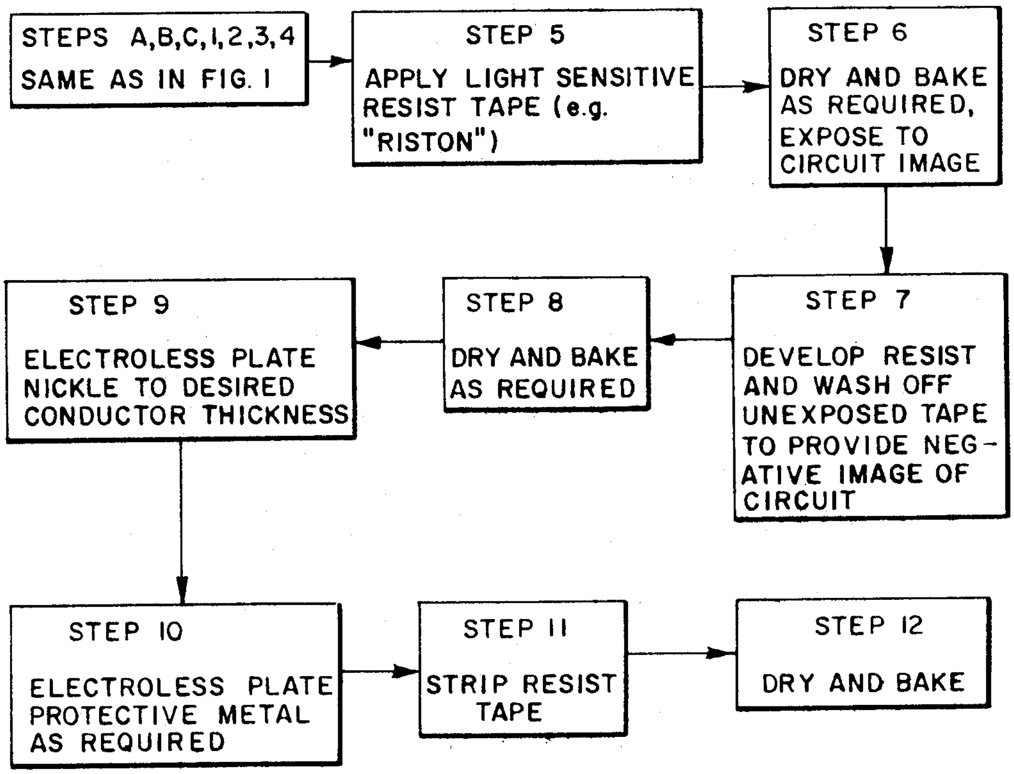

Another example of an all-nickel printed circuit is illustrated by the sequence of steps shown in FIG. 5. The procedure is otherwise essentially the same as that of example VII.

EXAMPLE XII

This illustrates a sequence employing only electroless metal deposition technique in building up the desired circuit, and a different type of resist. (See FIG. 6)

What is claimed is:

1. A method for preparing a printed circuitboard with improved adhesion between the conductor metal and a nonconductive substrate, which comprises first bonding anodized aluminum foil to a thermoset resin substrate under heat and pressure, said aluminum foil having been anodically treated on at least the surface abutting the thermoset resin substrate in a phosphoric acid solution; chemically stripping said aluminum foil to reexpose the substrate surface, catalyzing the stripped surface and plating said catalyzed surface with a conductor metal in the configuration of the desired circuit to provide a circuitboard, and heating the circuitboard at least once subsequent to the catalyzing step to raise the temperature of the board above ambient but substantially below that at which charring of the resin substrate occurs.

2. The method of claim 1 wherein the said anodically treated aluminum foil is stripped from the laminate by treating it for about 2 to about 30 minutes at a temperature of about 80° to about 180° F. with an aqueous solution of a material selected from the group consisting of sodium hydroxide, potassium hydroxide, lithium hydroxide and hydrochloric acid.

3. The method of claim 1 wherein the said aluminum foil is anodically treated in an electrolytic bath containing about 10 to about 60 weight percent of phosphoric acid for about 1 to about 30 minutes at a current density of from about 10 to about 75 a.s.f.

4. The method of claim 1 wherein the said resin is an epoxy resin.

5. The method of claim 1 wherein the resin is a phenolic resin.

6. The method of claim 1 wherein the said substrate is a reinforced thermoset resin substrate.

7. The method of claim 1 wherein the said substrate is reinforced with glass fiber. F. 8. The method of claim 1 wherein the board is heated to approximately 220° F. for 30 minutes.

9. The method of claim 1 wherein the board is heated after both the catalyzing and plating steps.

10. The method of claim 1 which comprises, in the sequence of steps immediately following catalyzation, electrolessly plating an initial thin copper or nickel deposit over the whole of said reexposed substrate surface, superimposing thereon a masking resist in a pattern to provide a configuration of the desired circuit, drying and baking the substrate, electroplating said substrate with additional conductor metal to build up a desired total thickness in the area of said desired circuit configuration, applying a metallic resist to the exposed conductor metal from a solution of the metallic resist, stripping the masking resist from the noncircuit portion of the surface, etching away all of the initial thin electroless copper or nickel deposit of said noncircuit portion, stripping the metallic resist from selected portions of the conductor circuit, electrolessly or electrolytically plating a protective metal of the class of gold, rhodium and nickel on said conductor circuit, and baking the completed circuit board.

11. The method of claim 1 which comprises, in the sequence of steps immediately following catalyzation, applying a masking resist pattern in the configuration of the desired circuit to be printed on said board, drying and baking the board, reactivating the exposed circuit area by contacting it with dilute acid solution, electrolessly plating said exposed circuit area with at least one conductive metal to a desired thickness, drying and baking the circuit board, stripping the masking resist from the noncircuit area of the surface, and baking the completed circuit board.

11. The method of claim 1 which comprises, in the sequence of steps immediately following catalyzation, applying a masking resist pattern in the configuration of the desired circuit to be printed on said board, drying and baking the board, reactivating the exposed circuit area by contacting it with dilute acid solution, electrolessly plating said exposed circuit area with at least one conductive metal to a desired thickness, drying an baking the circuit board, sripping the masking resist from the noncircuit area of the surface, and baking the completed circuit board.

* * * * *